United States Patent
Dobisz et al.

(10) Patent No.: US 10,424,726 B2
(45) Date of Patent: Sep. 24, 2019

(54) PROCESS FOR IMPROVING PHOTORESIST PILLAR ADHESION DURING MRAM FABRICATION

(71) Applicant: SPIN TRANSFER TECHNOLOGIES, INC., Fremont, CA (US)

(72) Inventors: Elizabeth Dobisz, Fremont, CA (US); Pradeep Manandhar, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/857,318

(22) Filed: Dec. 28, 2017

(65) Prior Publication Data
US 2019/0207100 A1   Jul. 4, 2019

(51) Int. Cl.
| H01L 21/00 | (2006.01) |
| H01L 43/12 | (2006.01) |
| H01L 27/22 | (2006.01) |
| G03F 7/075 | (2006.01) |
| G03F 7/00 | (2006.01) |
| H01L 21/027 | (2006.01) |

(52) U.S. Cl.
CPC ............ H01L 43/12 (2013.01); G03F 7/0035 (2013.01); G03F 7/0751 (2013.01); H01L 21/0274 (2013.01); H01L 27/222 (2013.01)

(58) Field of Classification Search
CPC ....... H01L 43/12; G03F 7/0035; G03F 7/0751
USPC .......................................................... 438/3
See application file for complete search history.

(56) References Cited

U.S. PATENT DOCUMENTS

| 4,597,487 A | 7/1986 | Crosby et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |

(Continued)

FOREIGN PATENT DOCUMENTS

| CA | 2766141 | 1/2011 |
| CN | 105706259 | 6/2016 |

(Continued)

OTHER PUBLICATIONS

US 2016/0218273 A1, 07/2016, Pinarbasi (withdrawn)
(Continued)

*Primary Examiner* — David S Blum (57) ABSTRACT

A method for improving photo resist adhesion to an underlying hard mask layer. The method includes a cleaning step that includes applying tetramethylammonium hydroxide (TMAH) to coat a hard mask layer of a wafer. The method further includes puddle developing the wafer for a first desired amount of time, and rinsing the wafer in running water for a second desired amount of time. The method further includes spin drying the wafer, and baking the wafer for a third desired amount of time. The method concludes with the proceeding of subsequent photolithographic processes on the wafer.

20 Claims, 4 Drawing Sheets

(56) References Cited

U.S. PATENT DOCUMENTS

| | | |
|---|---|---|
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bbamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | You et al. |
| 6,773,515 B2 | 8/2004 | Li et al. |
| 6,777,730 B2 | 8/2004 | Daughton et al. |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,642,612 B2 | 1/2010 | Izumi et al. |
| 7,776,665 B2 | 8/2010 | Izumi et al. |
| 7,911,832 B2 | 3/2011 | Kent et al. |
| 7,936,595 B2 | 5/2011 | Han et al. |
| 7,986,544 B2 | 7/2011 | Kent et al. |
| 8,080,365 B2 | 12/2011 | Nozaki |
| 8,088,556 B2 | 1/2012 | Nozaki |
| 8,279,666 B2 | 10/2012 | Dieny et al. |
| 8,334,213 B2 | 12/2012 | Mao |
| 8,349,536 B2 | 1/2013 | Nozaki |
| 8,363,465 B2 | 1/2013 | Kent et al. |
| 8,456,883 B1 | 6/2013 | Liu |
| 8,492,881 B2 | 7/2013 | Kuroiwa et al. |
| 8,535,952 B2 | 9/2013 | Ranjan et al. |
| 8,574,928 B2 | 11/2013 | Satoh et al. |
| 8,617,408 B2 | 12/2013 | Balamane |
| 8,716,817 B2 | 5/2014 | Saida |
| 8,737,137 B1 | 5/2014 | Choy et al. |
| 8,737,437 B2 | 5/2014 | Choy et al. |
| 8,792,269 B1 | 7/2014 | Abedifard |
| 9,019,754 B1 | 4/2015 | Bedeschi |
| 9,082,888 B2 | 7/2015 | Kent et al. |
| 9,263,667 B1 | 2/2016 | Pinarbasi |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,449,720 B1 | 9/2016 | Lung |
| 9,450,180 B1 | 9/2016 | Annunziata |
| 9,588,416 B2 | 3/2017 | Englund et al. |
| 9,772,555 B2 | 9/2017 | Park et al. |
| 9,853,006 B2 | 12/2017 | Arvin et al. |
| 9,853,292 B2 | 12/2017 | Loveridge et al. |
| 9,865,806 B2 | 1/2018 | Choi et al. |
| 10,026,609 B2 | 7/2018 | Sreenivasan et al. |
| 10,043,851 B1 | 8/2018 | Shen |
| 10,115,446 B1 | 10/2018 | Louie et al. |
| 2002/0008949 A1 | 1/2002 | Ito et al. |
| 2002/0022237 A1 | 2/2002 | Doan et al. |
| 2002/0042158 A1 | 4/2002 | Kersch et al. |
| 2002/0057593 A1 | 5/2002 | Hidaka |
| 2002/0090533 A1 | 7/2002 | Zhang et al. |
| 2002/0105823 A1 | 8/2002 | Redon et al. |
| 2002/0105827 A1 | 8/2002 | Redon et al. |
| 2002/0132140 A1 | 9/2002 | Igarashi et al. |
| 2002/0146580 A1 | 10/2002 | Wang et al. |
| 2002/0154539 A1 | 10/2002 | Swanson et al. |
| 2003/0007398 A1 | 1/2003 | Daughton et al. |
| 2003/0045962 A1 | 3/2003 | You et al. |
| 2003/0048659 A1 | 3/2003 | Kanamori |
| 2003/0048676 A1 | 3/2003 | Daughton et al. |
| 2003/0085186 A1 | 5/2003 | Fujioka |
| 2003/0117840 A1 | 6/2003 | Sharma et al. |
| 2003/0133232 A1 | 7/2003 | Li et al. |
| 2003/0134096 A1 | 7/2003 | Chen et al. |
| 2003/0151944 A1 | 8/2003 | Saito |
| 2003/0185050 A1 | 10/2003 | Kishi et al. |
| 2003/0197984 A1 | 10/2003 | Inomata et al. |
| 2003/0218903 A1 | 11/2003 | Luo |
| 2003/0219240 A1 | 11/2003 | Levy |
| 2003/0231098 A1 | 12/2003 | Wan |
| 2004/0012994 A1 | 1/2004 | Slaughter et al. |
| 2004/0026369 A1 | 2/2004 | Ying |
| 2004/0027853 A1 | 2/2004 | Huai et al. |
| 2004/0042261 A1 | 3/2004 | Tuttle |

(56) References Cited

U.S. PATENT DOCUMENTS

| | | |
|---|---|---|
| 2004/0044870 A1 | 3/2004 | Pawlowski |
| 2004/0047179 A1 | 3/2004 | Chan |
| 2004/0061154 A1 | 4/2004 | Huai et al. |
| 2004/0080876 A1 | 4/2004 | Sugita et al. |
| 2004/0094785 A1 | 5/2004 | Zhu et al. |
| 2004/0114444 A1 | 6/2004 | Matsuoka |
| 2004/0130936 A1 | 7/2004 | Nguyen et al. |
| 2004/0130940 A1 | 7/2004 | Huai et al. |
| 2004/0136231 A1 | 7/2004 | Huai et al. |
| 2004/0170055 A1 | 9/2004 | Albert et al. |
| 2004/0173315 A1 | 9/2004 | Leung |
| 2004/0185675 A1 | 9/2004 | Lu et al. |
| 2004/0197174 A1 | 10/2004 | Van Den Berg |
| 2004/0211996 A1 | 10/2004 | Ross et al. |
| 2004/0213039 A1 | 10/2004 | Kawabata et al. |
| 2004/0221030 A1 | 11/2004 | Huras |
| 2004/0221095 A1 | 11/2004 | Estakhri |
| 2004/0223266 A1 | 11/2004 | Li et al. |
| 2004/0235201 A1 | 11/2004 | Albert et al. |
| 2004/0246775 A1 | 12/2004 | Covington |
| 2004/0257717 A1 | 12/2004 | Sharma et al. |
| 2004/0266179 A1 | 12/2004 | Sharma |
| 2005/0006682 A1 | 1/2005 | Bae et al. |
| 2005/0022746 A1 | 2/2005 | Lampe |
| 2005/0029551 A1 | 2/2005 | Atwood et al. |
| 2005/0041342 A1 | 2/2005 | Huai et al. |
| 2005/0041462 A1 | 2/2005 | Kent et al. |
| 2005/0045913 A1 | 3/2005 | Nguyen et al. |
| 2005/0051820 A1 | 3/2005 | Stojakovic et al. |
| 2005/0063222 A1 | 3/2005 | Huai et al. |
| 2005/0078418 A1 | 4/2005 | Saito et al. |
| 2005/0081085 A1 | 4/2005 | Ellis |
| 2005/0104101 A1 | 5/2005 | Sun et al. |
| 2005/0122768 A1 | 6/2005 | Fukumoto |
| 2005/0128842 A1 | 6/2005 | Wei |
| 2005/0136600 A1 | 6/2005 | Huai |
| 2005/0158881 A1 | 7/2005 | Sharma |
| 2005/0160205 A1 | 7/2005 | Kuo |
| 2005/0174702 A1 | 8/2005 | Gill |
| 2005/0180202 A1 | 8/2005 | Huai et al. |
| 2005/0180203 A1 | 8/2005 | Lin et al. |
| 2005/0184839 A1 | 8/2005 | Nguyen et al. |
| 2005/0185455 A1 | 8/2005 | Huai |
| 2005/0189574 A1 | 9/2005 | Nguyen et al. |
| 2005/0201023 A1 | 9/2005 | Huai et al. |
| 2005/0237787 A1 | 10/2005 | Huai et al. |
| 2005/0248980 A1 | 11/2005 | Han et al. |
| 2005/0251628 A1 | 11/2005 | Jarvis et al. |
| 2005/0260773 A1 | 11/2005 | Hong et al. |
| 2005/0276099 A1 | 12/2005 | Horng et al. |
| 2005/0280058 A1 | 12/2005 | Pakala et al. |
| 2005/0285176 A1 | 12/2005 | Kim |
| 2006/0018057 A1 | 1/2006 | Huai |
| 2006/0030058 A1 | 2/2006 | Kent et al. |
| 2006/0049472 A1 | 3/2006 | Diao et al. |
| 2006/0062044 A1 | 3/2006 | Jeong |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0198202 A1 | 9/2006 | Erez |
| 2006/0209591 A1 | 9/2006 | Hong et al. |
| 2006/0227465 A1 | 10/2006 | Inokuchi et al. |
| 2006/0227598 A1 | 10/2006 | Sakimura |
| 2006/0256611 A1 | 11/2006 | Bednorz et al. |
| 2006/0271755 A1 | 11/2006 | Miura |
| 2006/0284183 A1 | 12/2006 | Izumi et al. |
| 2006/0291305 A1 | 12/2006 | Suzuki et al. |
| 2007/0019337 A1 | 1/2007 | Apalkov et al. |
| 2007/0030728 A1 | 2/2007 | Kent et al. |
| 2007/0063690 A1 | 3/2007 | DeWilde et al. |
| 2007/0094573 A1 | 4/2007 | Chen |
| 2007/0096229 A1 | 5/2007 | Yoshikawa |
| 2007/0148789 A1 | 6/2007 | Bae et al. |
| 2007/0159870 A1 | 7/2007 | Tanizaki |
| 2007/0220935 A1 | 9/2007 | Cernea |
| 2007/0226592 A1 | 9/2007 | Radke |
| 2007/0242501 A1 | 10/2007 | Hung et al. |
| 2007/0245093 A1 | 10/2007 | Do et al. |
| 2007/0283313 A1 | 12/2007 | Ogawa |
| 2007/0285972 A1 | 12/2007 | Horii |
| 2008/0049487 A1 | 2/2008 | Yoshimura |
| 2008/0049488 A1 | 2/2008 | Rizzo |
| 2008/0079530 A1 | 4/2008 | Weidman |
| 2008/0112094 A1 | 5/2008 | Kent et al. |
| 2008/0144376 A1 | 6/2008 | Lee |
| 2008/0151614 A1 | 6/2008 | Guo |
| 2008/0175062 A1 | 7/2008 | Van Tran |
| 2008/0181009 A1 | 7/2008 | Arai |
| 2008/0259508 A2 | 10/2008 | Kent et al. |
| 2008/0259689 A1 | 10/2008 | Roohparvar |
| 2008/0266943 A1 | 10/2008 | Yang |
| 2008/0293165 A1 | 11/2008 | Ranjan et al. |
| 2008/0294938 A1 | 11/2008 | Kondo |
| 2008/0297292 A1 | 12/2008 | Viala et al. |
| 2009/0040825 A1 | 2/2009 | Adusumilli et al. |
| 2009/0046501 A1 | 2/2009 | Ranjan et al. |
| 2009/0072185 A1 | 3/2009 | Raksha et al. |
| 2009/0078927 A1 | 3/2009 | Xiao |
| 2009/0080267 A1 | 3/2009 | Bedeschi |
| 2009/0091037 A1 | 4/2009 | Assefa et al. |
| 2009/0098413 A1 | 4/2009 | Kanegae |
| 2009/0130779 A1 | 5/2009 | Li |
| 2009/0146231 A1 | 6/2009 | Kuper et al. |
| 2009/0161421 A1 | 6/2009 | Cho et al. |
| 2009/0168506 A1 | 7/2009 | Han et al. |
| 2009/0209102 A1 | 8/2009 | Zhong et al. |
| 2009/0231909 A1 | 9/2009 | Dieny et al. |
| 2009/0296452 A1 | 12/2009 | Tonomura |
| 2009/0296462 A1 | 12/2009 | Kent et al. |
| 2009/0323404 A1 | 12/2009 | Jung |
| 2010/0034009 A1 | 2/2010 | Lu |
| 2010/0039136 A1 | 2/2010 | Chua-Eoan |
| 2010/0080040 A1 | 4/2010 | Choi |
| 2010/0087048 A1 | 4/2010 | Izumi et al. |
| 2010/0110803 A1 | 5/2010 | Arai |
| 2010/0122153 A1 | 5/2010 | Fifield et al. |
| 2010/0124091 A1 | 5/2010 | Cowburn |
| 2010/0162065 A1 | 6/2010 | Norman |
| 2010/0193891 A1 | 8/2010 | Wang et al. |
| 2010/0195362 A1 | 8/2010 | Norman |
| 2010/0195401 A1 | 8/2010 | Jeong et al. |
| 2010/0227275 A1 | 9/2010 | Nozaki |
| 2010/0232206 A1 | 9/2010 | Li |
| 2010/0246254 A1 | 9/2010 | Prejbeanu et al. |
| 2010/0248154 A1 | 9/2010 | Nozaki |
| 2010/0254181 A1 | 10/2010 | Chung |
| 2010/0254182 A1 | 10/2010 | Kuroiwa et al. |
| 2010/0271090 A1 | 10/2010 | Rasmussen |
| 2010/0271870 A1 | 10/2010 | Zheng et al. |
| 2010/0277976 A1 | 11/2010 | Oh |
| 2010/0290275 A1 | 11/2010 | Park et al. |
| 2010/0311243 A1 | 12/2010 | Mao |
| 2011/0001108 A1 | 1/2011 | Greene |
| 2011/0007560 A1 | 1/2011 | Dieny et al. |
| 2011/0032645 A1 | 2/2011 | Noel et al. |
| 2011/0038198 A1 | 2/2011 | Kent et al. |
| 2011/0050196 A1 | 3/2011 | Fuse |
| 2011/0050330 A1 | 3/2011 | Miki |
| 2011/0058412 A1 | 3/2011 | Zheng et al. |
| 2011/0061786 A1 | 3/2011 | Mason |
| 2011/0076620 A1 | 3/2011 | Nozaki |
| 2011/0089511 A1 | 4/2011 | Keshtbod et al. |
| 2011/0115094 A1 | 5/2011 | Darnon et al. |
| 2011/0119538 A1 | 5/2011 | Ipek |
| 2011/0133298 A1 | 6/2011 | Chen et al. |
| 2011/0157966 A1 | 6/2011 | Lee |
| 2011/0267874 A1 | 11/2011 | Ryu |
| 2011/0283135 A1 | 11/2011 | Burger |
| 2011/0310691 A1 | 12/2011 | Zhou et al. |
| 2011/0320696 A1 | 12/2011 | Fee et al. |
| 2012/0008380 A1 | 1/2012 | El Baraji |
| 2012/0028373 A1 | 2/2012 | Belen |
| 2012/0052258 A1 | 3/2012 | Op DeBeeck et al. |

(56) References Cited

U.S. PATENT DOCUMENTS

| | | |
|---|---|---|
| 2012/0069649 A1 | 3/2012 | Ranjan et al. |
| 2012/0103792 A1 | 5/2012 | Kent et al. |
| 2012/0127804 A1 | 5/2012 | Ong et al. |
| 2012/0155156 A1 | 6/2012 | Watts |
| 2012/0155158 A1 | 6/2012 | Higo |
| 2012/0159283 A1 | 6/2012 | Lu |
| 2012/0163113 A1 | 6/2012 | Hatano et al. |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0221905 A1 | 8/2012 | Burger |
| 2012/0228728 A1 | 9/2012 | Ueki et al. |
| 2012/0239969 A1 | 9/2012 | Dickens |
| 2012/0254636 A1 | 10/2012 | Tsukamoto et al. |
| 2012/0257444 A1 | 10/2012 | Oh |
| 2012/0257448 A1 | 10/2012 | Ong |
| 2012/0268996 A1 | 10/2012 | Park |
| 2012/0280339 A1 | 11/2012 | Zhang et al. |
| 2012/0294078 A1 | 11/2012 | Kent et al. |
| 2012/0299133 A1 | 11/2012 | Son et al. |
| 2012/0314478 A1 | 12/2012 | Ha |
| 2012/0324274 A1 | 12/2012 | Hori |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1 | 2/2013 | Rao |
| 2013/0044537 A1 | 2/2013 | Ishigaki |
| 2013/0045589 A1 | 2/2013 | Kim et al. |
| 2013/0069185 A1 | 3/2013 | Saida |
| 2013/0075845 A1 | 3/2013 | Chen et al. |
| 2013/0092654 A1 | 4/2013 | Balamane |
| 2013/0107633 A1 | 5/2013 | Kim |
| 2013/0148405 A1 | 6/2013 | Kang |
| 2013/0188414 A1 | 7/2013 | Kawai |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270611 A1 | 10/2013 | Yi et al. |
| 2013/0270661 A1 | 10/2013 | Yi et al. |
| 2013/0275682 A1 | 10/2013 | Ramanujan |
| 2013/0275691 A1 | 10/2013 | Chew |
| 2013/0307097 A1 | 11/2013 | Yi et al. |
| 2013/0318288 A1 | 11/2013 | Khan |
| 2013/0341801 A1 | 12/2013 | Satoh et al. |
| 2014/0009994 A1 | 1/2014 | Parkin et al. |
| 2014/0036573 A1 | 2/2014 | Ishihara |
| 2014/0042571 A1 | 2/2014 | Gan et al. |
| 2014/0048896 A1 | 2/2014 | Huang et al. |
| 2014/0063949 A1 | 3/2014 | Tokiwa |
| 2014/0070341 A1 | 3/2014 | Beach et al. |
| 2014/0089762 A1 | 3/2014 | Pangal et al. |
| 2014/0103469 A1 | 4/2014 | Jan |
| 2014/0103472 A1 | 4/2014 | Kent et al. |
| 2014/0136870 A1 | 5/2014 | Breternitz et al. |
| 2014/0149822 A1 | 5/2014 | Wilkerson |
| 2014/0149827 A1 | 5/2014 | Kim et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0181615 A1 | 6/2014 | Kwok |
| 2014/0181618 A1 | 6/2014 | Wu |
| 2014/0217531 A1 | 8/2014 | Jan |
| 2014/0219034 A1 | 8/2014 | Gomez et al. |
| 2014/0252439 A1 | 9/2014 | Guo |
| 2014/0264671 A1 | 9/2014 | Chepulskyy et al. |
| 2014/0269005 A1 | 9/2014 | Kang |
| 2014/0269030 A1 | 9/2014 | Chih |
| 2014/0281284 A1 | 9/2014 | Block et al. |
| 2014/0281805 A1 | 9/2014 | Sah |
| 2014/0289358 A1 | 9/2014 | Lindamood |
| 2014/0315329 A1 | 10/2014 | Deshpande |
| 2014/0321196 A1 | 10/2014 | Ikeda |
| 2015/0022264 A1 | 1/2015 | Kim |
| 2015/0056368 A1 | 2/2015 | Wang et al. |
| 2015/0089310 A1 | 3/2015 | Motwani |
| 2015/0095736 A1 | 4/2015 | Leem |
| 2015/0098287 A1 | 4/2015 | Lee |
| 2015/0100848 A1 | 4/2015 | Kalamatianos |
| 2015/0135039 A1 | 5/2015 | Mekhanik et al. |
| 2015/0143343 A1 | 5/2015 | Weiss |
| 2015/0154116 A1 | 6/2015 | Dittrich |
| 2015/0171316 A1 | 6/2015 | Park et al. |
| 2015/0206566 A1 | 7/2015 | Bose |
| 2015/0206568 A1 | 7/2015 | Bose et al. |
| 2015/0206569 A1 | 7/2015 | Bose et al. |
| 2015/0242269 A1 | 8/2015 | Pelley et al. |
| 2015/0243335 A1 | 8/2015 | Naeimi |
| 2015/0262701 A1 | 9/2015 | Takizawa |
| 2015/0278011 A1 | 10/2015 | Keppel et al. |
| 2015/0279904 A1 | 10/2015 | Pinarbasi et al. |
| 2015/0378814 A1 | 12/2015 | Webb et al. |
| 2015/0380088 A1 | 12/2015 | Naeimi et al. |
| 2016/0027525 A1 | 1/2016 | Kim et al. |
| 2016/0027999 A1 | 1/2016 | Pinarbasi |
| 2016/0043304 A1 | 2/2016 | Chen |
| 2016/0056072 A1 | 2/2016 | Arvin et al. |
| 2016/0056167 A1 | 2/2016 | Wang |
| 2016/0070474 A1 | 3/2016 | Yu |
| 2016/0085443 A1 | 3/2016 | Tomishima et al. |
| 2016/0085621 A1 | 3/2016 | Motwani |
| 2016/0085692 A1 | 3/2016 | Kwok |
| 2016/0086600 A1 | 3/2016 | Bauer et al. |
| 2016/0087193 A1 | 3/2016 | Pinarbasi et al. |
| 2016/0093798 A1 | 3/2016 | Kim et al. |
| 2016/0111634 A1 | 4/2016 | Lee et al. |
| 2016/0118249 A1 | 4/2016 | Sreenivasan et al. |
| 2016/0124299 A1 | 5/2016 | Yu et al. |
| 2016/0125926 A1 | 5/2016 | Kim |
| 2016/0126201 A1 | 5/2016 | Arvin et al. |
| 2016/0126452 A1 | 5/2016 | Kuo et al. |
| 2016/0126453 A1 | 5/2016 | Chen et al. |
| 2016/0148685 A1 | 5/2016 | Roy |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0196876 A1 | 7/2016 | Lee |
| 2016/0218278 A1 | 7/2016 | Pinarbasi et al. |
| 2016/0260486 A1 | 9/2016 | Tani |
| 2016/0268499 A1 | 9/2016 | You |
| 2016/0283385 A1 | 9/2016 | Boyd et al. |
| 2016/0284762 A1 | 9/2016 | Wang et al. |
| 2016/0300615 A1 | 10/2016 | Lee |
| 2016/0307860 A1 | 10/2016 | Arvin et al. |
| 2016/0315118 A1 | 10/2016 | Kardasz et al. |
| 2016/0315249 A1 | 10/2016 | Kardasz et al. |
| 2016/0315259 A1 | 10/2016 | Fennimore et al. |
| 2016/0322090 A1 | 11/2016 | Chung |
| 2016/0358778 A1 | 12/2016 | Park et al. |
| 2016/0372214 A1 | 12/2016 | Shim |
| 2016/0372656 A1 | 12/2016 | Pinarbasi et al. |
| 2016/0378592 A1 | 12/2016 | Ikegami et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0047107 A1 | 2/2017 | Berger et al. |
| 2017/0062712 A1 | 3/2017 | Choi et al. |
| 2017/0069837 A1 | 3/2017 | Choi et al. |
| 2017/0084826 A1 | 3/2017 | Zhou et al. |
| 2017/0123991 A1 | 5/2017 | Sela et al. |
| 2017/0133104 A1 | 5/2017 | Darbari et al. |
| 2017/0148979 A1 | 5/2017 | Kim et al. |
| 2017/0199459 A1 | 7/2017 | Ryu et al. |
| 2017/0222132 A1 | 8/2017 | Pinarbasi et al. |
| 2017/0270988 A1 | 9/2017 | Ikegami |
| 2018/0018134 A1 | 1/2018 | Kang |
| 2018/0019343 A1 | 1/2018 | Asami |
| 2018/0033957 A1 | 2/2018 | Zhang |
| 2018/0097006 A1 | 4/2018 | Kim et al. |
| 2018/0097175 A1 | 4/2018 | Chuang |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |

(56) References Cited

U.S. PATENT DOCUMENTS

| | | |
|---|---|---|
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1* | 8/2018 | Glodde ............... H01L 21/0338 |
| 2018/0233363 A1* | 8/2018 | Glodde ............... H01L 21/0337 |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

Bhatti Sabpreet et al., "Spintronics Based Random Access Memory: a Review," Material Today, Nov. 2107, pp. 530-548, vol. 20, No. 9, Elsevier,.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFe8-MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No, 23, Jun. 5, 2000, pp. 5419-5422 (4 pages).

K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights,. Sep. 2010, 3 pages.

Daniel Scott Matic, "A Magnetic Tunnel Junction Compact Model for Sit-Ram and MeRAM", Master Thesis University of California, Los Angeles, 2013, pp. 43.

\* cited by examiner

PROCESS FOR IMPROVING PHOTORESIST PILLAR ADHESION DURING MRAM FABRICATION

FIELD OF THE INVENTION

Embodiments of the present invention are generally related to the fabrication of integrated circuit structures used in memory systems that can be used by computer systems, including embedded computer systems.

BACKGROUND OF THE INVENTION

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. This structure is known as a magnetic tunnel junction (MTJ).

MRAM devices can store information by changing the orientation of the magnetization of the free layer of the MTJ. In particular, based on whether the free layer is in a parallel or anti-parallel alignment relative to the reference layer, either a one or a zero can be stored in each MRAM cell. Due to the spin-polarized electron tunneling effect, the electrical resistance of the cell change due to the orientation of the magnetic fields of the two layers. The electrical resistance is typically referred to as tunnel magnetoresistance (TMR) which is a magnetoresistive effect that occurs in a MTJ. The cell's resistance will be different for the parallel and anti-parallel states and thus the cell's resistance can be used to distinguish between a one and a zero. One important feature of MRAM devices is that they are non-volatile memory devices, since they maintain the information even when the power is off.

MRAM devices are considered as the next generation structures for a wide range of memory applications. MRAM products based on spin torque transfer switching are already making its way into large data storage devices. Spin transfer torque magnetic random access memory (STT-MRAM), or spin transfer switching, uses spin-aligned (polarized) electrons to change the magnetization orientation of the free layer in the magnetic tunnel junction. In general, electrons possess a spin, a quantized number of angular momentum intrinsic to the electron. An electrical current is generally unpolarized, e.g., it consists of 50% spin up and 50% spin down electrons. Passing a current though a magnetic layer polarizes electrons with the spin orientation corresponding to the magnetization direction of the magnetic layer (e.g., polarizer), thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a one or a zero based on whether the free layer is in the parallel or anti-parallel states relative to the reference layer.

Using typical photolithography techniques, small (≤60 nm diameter) magnetic memory devices are printed by electron beam lithography and Hydrogen_silsesquioxane (HSQ) resist. E-Beam lithography is employed to define the MRAM features because of its very high resolution at low cost, relative to other lithographic approaches. This greatly facilitates and accelerates MRAM device development.

HSQ is the resist material of choice because it is a high resolution negative resist that is also highly resistant to reactive ion etch. In negative resists, the regions that were e-beam exposed remain on the wafer after development. A pillar structure is defined by exposure of a small region on the wafer. The resulting resist pattern is a series of pillars of HSQ of diameter and density of the desired device. The pillar pattern is etched into the underlying hard mask for the ion etching process to produce the magnetic tunnel junctions.

There is a problem, however, in that resist pillars with height to diameter aspect ratios ≥2-3/1 are mechanically unstable and fall, which reduces the device yield. One prior art approach to the problem is to decrease the thickness of the resist. However, although HSQ is very etch resistant, it has a finite etch rate. At thicknesses below 80 nm, the etch rate is significant. The etch rate of the HSQ pillar is further accelerated by the geometry of the pillar which is subject to significant edge erosion. An HSQ pillar etches much more rapidly than a full film of HSQ of the same thickness.

HSQ adhesion has been problematic for many uses. Adhesion is made worse if the wafer is in the clean room for more than approximately 2 weeks after deposition. Also, individual wafers from the same batch have been observed to have different pillar yield. Other commercial solutions include surface treatment with Hexamethyldisilazane (HMDS) and SurPas 3000/4000. These have not improved HSQ adhesion. Also known, surface treatments of (3-mercaptopropyl) trimethoxysilane (MPTMS) and Poly (diallyldimethylammonium) chloride (PDDA) modifications for Au and (3-Aminopropyl) triethoxysilane (APTES) for Mo surfaces and either PDDA or APTES for Si, Cr, Cu and ITO surfaces (see literature Zhiqiang Zhang a, Huigao Duan, Yihui Wu, Wuping Zhou, Cong Li, Yuguo Tang, Haiwen Li, Microelectronic Engineering 128 (2014) 59-65). The authors have not demonstrated the adhesion improvement in very small pillars. Francesco Narda Viscomi, Ripon Kumar Dey, Roberto Caputo, and Bo Cui have reported enhanced adhesion of electron beam resist by grafted monolayer poly(methylmethacrylate-co-methacrylic acid) brush (Journal of Vacuum Science & Technology B 33, 06FD06 (2015)), but this method required additional processing and cleaning of the wafer with powerful reagents, and such processing is incompatible with the underlying magnetic tunnel junction substrate. Additionally, cleaning with simple solvents did not improve the adhesion.

Thus what is needed is a method to improve pillar adhesion to the surface. What is further needed is a surface treatment which readily integrates into the resist application process in an MRAM photolithography process.

SUMMARY OF THE INVENTION

This disclosure describes a method to improve pillar adhesion to the surface and to thereby improve pillar yield reproducibility. A surface treatment is described which readily integrates into the resist application process in a photolithographic process.

In one embodiment, the present invention is implemented as a method for improving photo resist adhesion to an underlying hard layer. The method includes applying tetramethylammonium hydroxide (TMAH) to coat, e.g., clean, a hard mask layer of a wafer. The TMAH is used as an adhesion promoter. The method further includes puddle developing the wafer for a first desired amount of time, and rinsing the wafer in running water for a second desired amount of time. The method further includes spin drying the wafer, and baking the wafer for a third desired amount of time. The method concludes with the proceeding of subsequent photolithographic processes on the wafer.

In one embodiment, the first desired amount of time is approximately 2 minutes. In one embodiment, the second desired amount of time is approximately 1 minute.

In one embodiment, the third desired amount of time is approximately 5 minutes. In one embodiment, the water is deionized water.

In one embodiment, the wafer is cooled on a chilled plate for approximately one minute subsequent to the baking.

In one embodiment, the wafer is treated with hexamethyldisilazane (HMDS) subsequent to the baking. In one embodiment, the underlying hard mask layer is tantalum nitride (TaN).

In one embodiment, the present invention is implemented as a method for improving photo resist pillar adhesion to a wafer. The method includes applying tetramethylammonium hydroxide (TMAH) to coat a tantalum nitride hard layer of a wafer, and puddle developing the wafer for a first desired amount of time (e.g., two minutes). In one embodiment, in addition to puddle development, the wafer can be dipped into a dish of TMAH and rinsed with deionized water and blow dried with dry inert gas. In this stage, the TMAH is used to clean the wafer and thereafter is being used as an adhesion promoter. The method further includes rinsing the wafer in running water (e.g., deionized water) for a second desired amount of time (e.g., one minute). The method further includes spin drying the wafer, baking the wafer for a third desired amount of time (e.g., five minutes), and proceeding with subsequent photolithographic processes on the wafer.

In one embodiment, the present invention is implemented as a method for manufacturing an MRAM device. The method includes applying tetramethylammonium hydroxide (TMAH) to coat a tantalum nitride hard layer of a wafer, and puddle developing the wafer for a first desired amount of time (e.g., two minutes). The method further includes rinsing the wafer in running water (e.g., deionized water) for a second desired amount of time (e.g., one minute). The method further includes spin drying the wafer, baking the wafer for a third desired amount of time (e.g., five minutes), and proceeding with subsequent photolithographic processes on the wafer.

In this manner, embodiments of the present invention improve pillar adhesion to the surface. Embodiments of the present invention provide a surface treatment which readily integrates into the resist application process in an MRAM photolithography process.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

A Process for Improving Photoresist Pillar Adhesion During MRAM Fabrication

In one embodiment, the present invention is implemented as a method for improving photo resist adhesion to an underlying hard layer. The method includes applying tetramethylammonium hydroxide (TMAH) to coat a hard layer of a wafer. The TMAH is being used as a cleaning agent. The method further includes puddle developing the wafer for a first desired amount of time (e.g., two minutes), and rinsing the wafer in running water for a second desired amount of time (e.g., one minute). The method further includes spin drying the wafer, and baking the wafer for a third desired amount of time (e.g., five minutes). The method concludes with the proceeding of subsequent photolithographic processes on the wafer.

In one embodiment, the wafer is cooled on a chilled plate for approximately one minute subsequent to the baking.

In one embodiment, the wafer is treated with hexamethyldisilazane (HMDS) subsequent to the baking. Additionally, in one embodiment, the underlying hard mask layer is tantalum nitride (TaN).

It should be noted that the baking is necessary, because the TaN hard layer is extremely hydrophilic and spinning the wafer is insufficient to remove all of the water. The process is itemized below with the description of FIG. 1.

Figure 1:
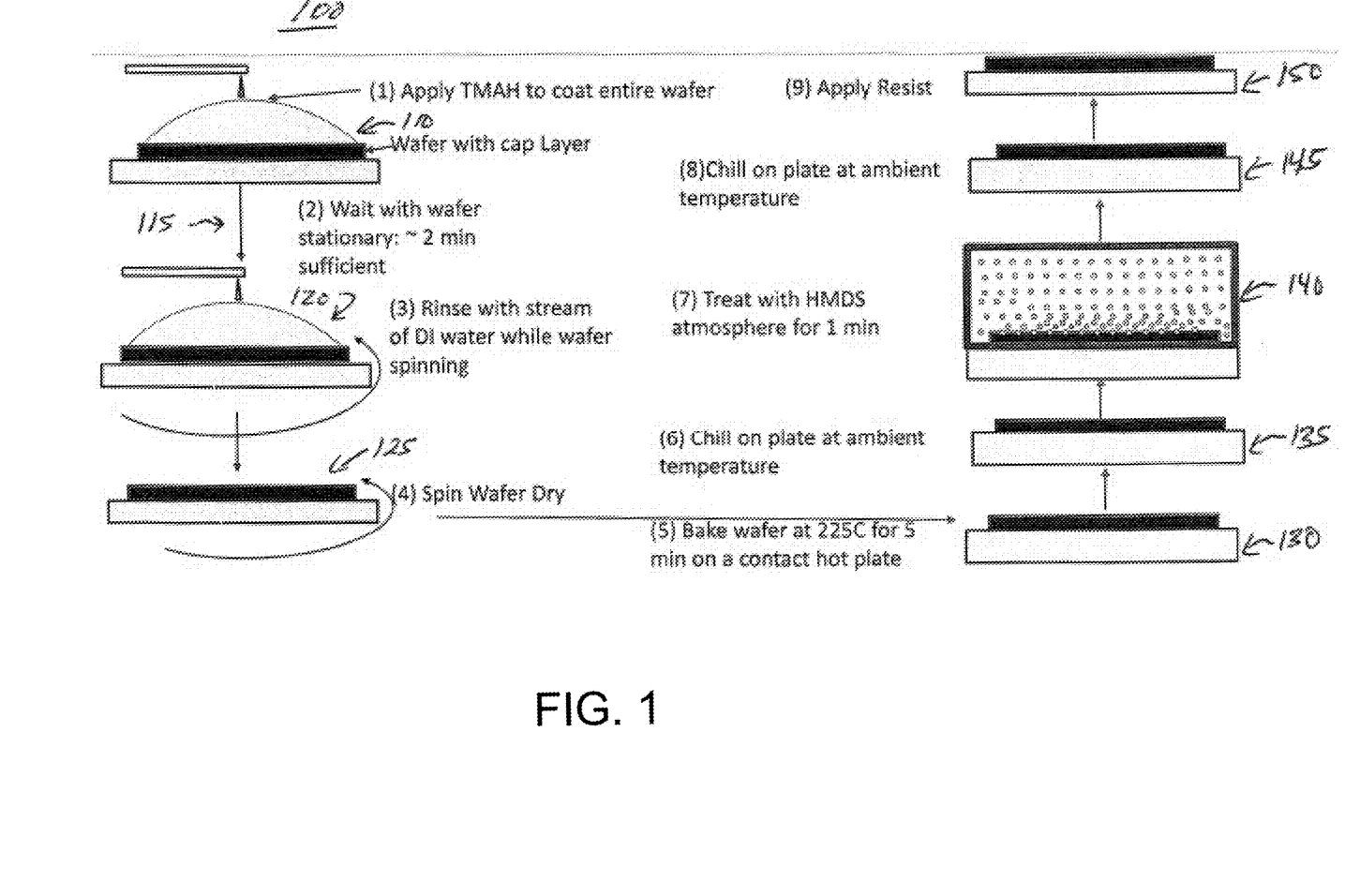
FIG. 1 visually depicts a method for improving photo resist adhesion to an underlying hard layer in accordance with one embodiment of the present invention.

FIG. 1 visually depicts a process 100 for improving photo resist adhesion to an underlying hard layer in accordance with one embodiment of the present invention. FIG. 1 shows on the left-hand side applying TMAH 110 to coat an entire wafer. This is a cleaning step. The process then waits 115 with the wafer stationary for approximately two minutes. Of course, other sufficient wait times can be used. The process then rinses 120 the wafer with deionized water while the wafer is spinning on a spinner. The wafer is then spun dry 125. The right-hand side of FIG. 1 shows baking the wafer at 225° C. for five minutes on for instance, a contact hotplate. The wafer is then chilled 135 on a chilled plate at ambient temperature (e.g., room temperature). The wafer is then treated 140 with an HMDS atmosphere for approximately one minute. The wafer is then chilled 145 on a chill plate at ambient room temperature. FIG. 1 finally shows applying the photoresist (e.g., HSQ) that will be used to form the pillars 150. Because of the surface treatment with TMAH as a cleaning agent, this HSQ will adhere much better to the hard mask layer. It should be noted that in one embodiment, the wafer may be submerged in a dish of TMAH rather than a puddle.

In this manner, embodiments of the present invention improve pillar adhesion to the surface. Embodiments of the present invention provide a surface treatment with TMAH which readily integrates into the resist application process in an MRAM photolithography process.

Figure 2:
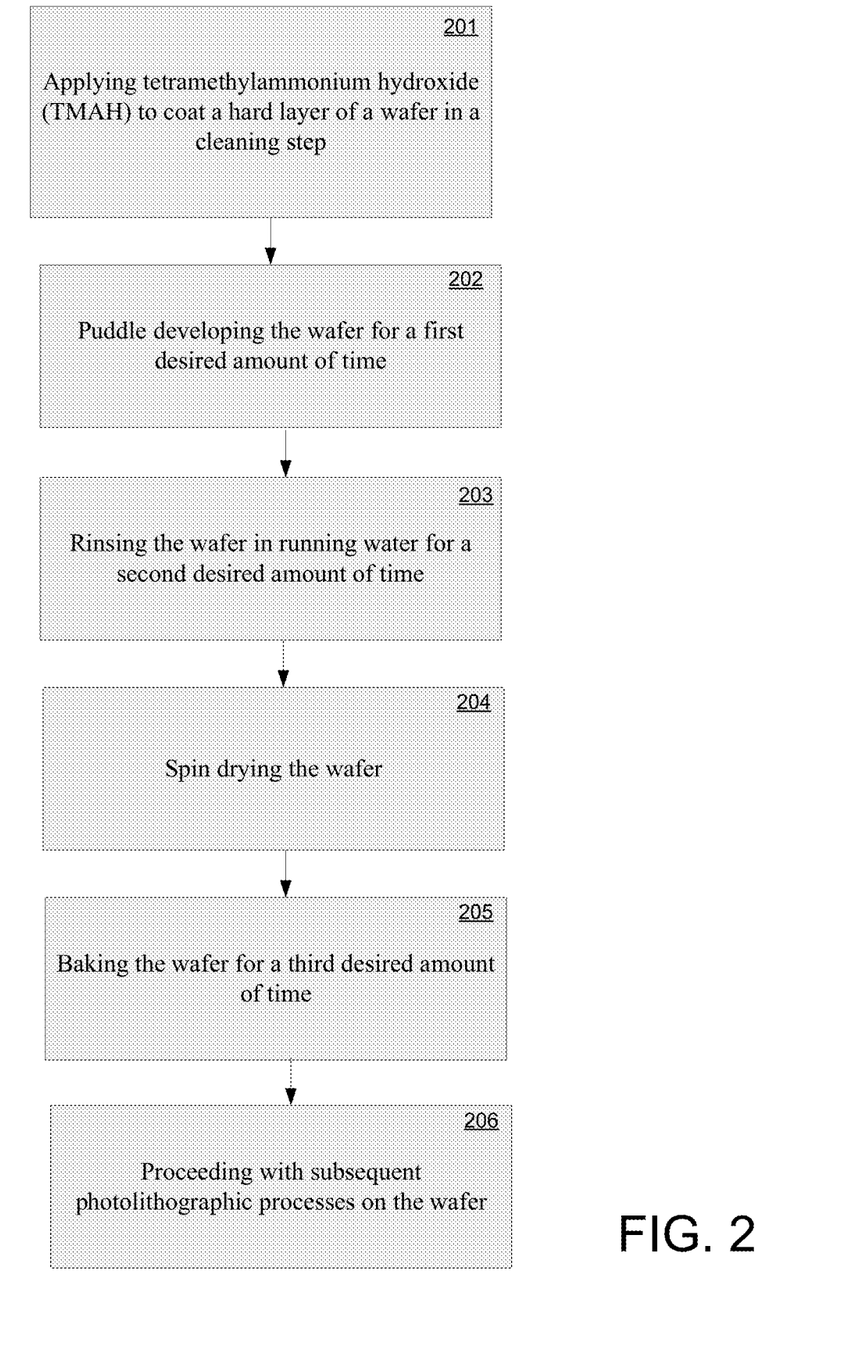
FIG. 2 shows a flowchart of the steps of a method for improving photo resist adhesion in accordance with one embodiment of the present invention.

FIG. 2 shows a flowchart of the steps of a method for improving photo resist adhesion in accordance with one embodiment of the present invention. In step 201, tetramethylammonium hydroxide (TMAH) is applied to coat a hard mask layer of a wafer as a cleaning agent. In step 202, the wafer is puddle developed for a first desired amount of time (e.g., two minutes). In step 203, the wafer is rinsed in running water (e.g., deionized water) for a second desired amount of time (e.g., one minute). In step 204, the wafer is spin dried. In step 205, the wafer is baked for a third desired amount of time (e.g., five minutes). The method concludes with step 206, the proceeding of subsequent photolithographic processes on the wafer.

Figure 3:
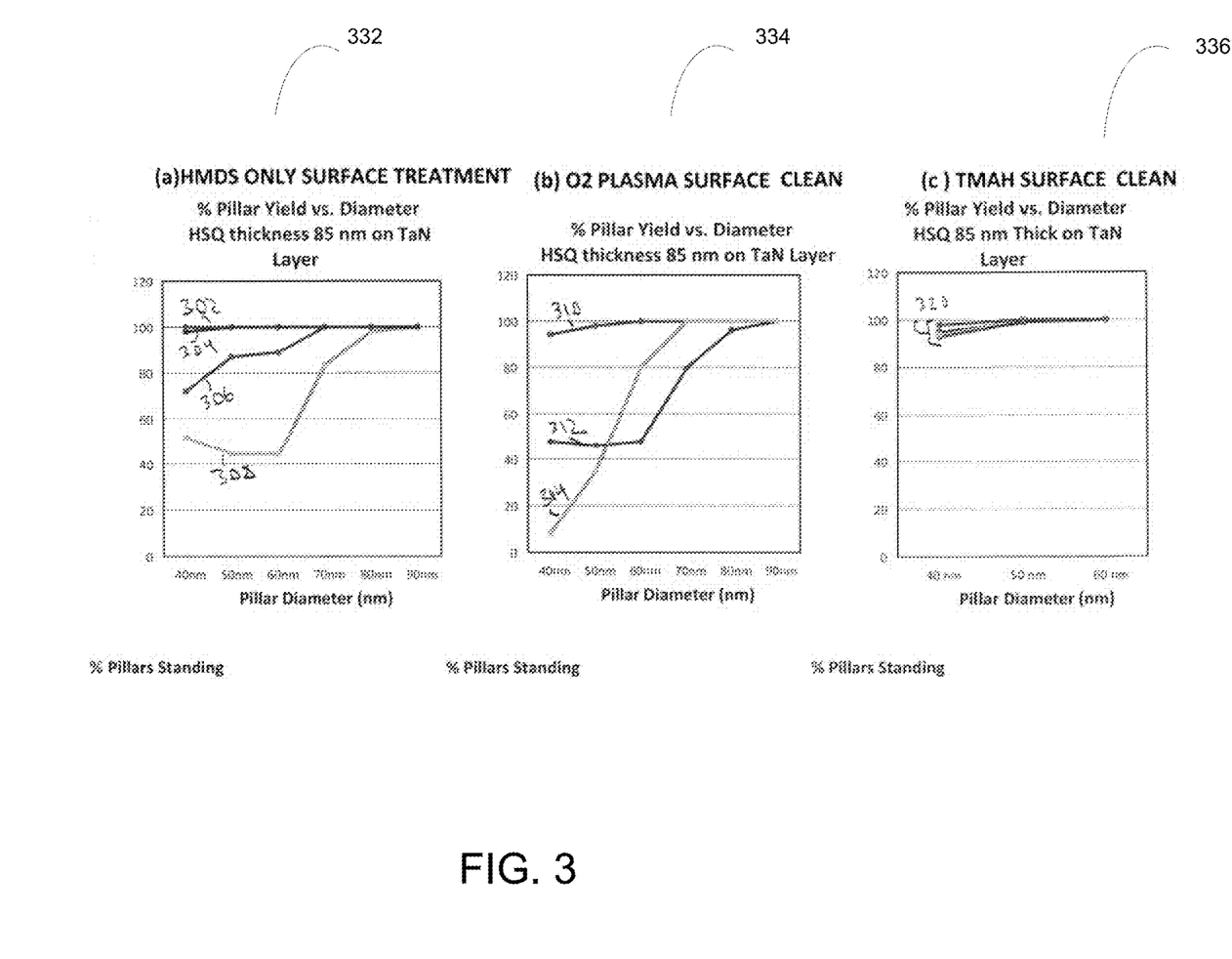
FIG. 3 shows a diagram 302, a diagram 304, and a diagram 306 showing percentage pillar yield in accordance with embodiments of the present invention.

FIG. 3 shows a diagram 332, a diagram 334, and a diagram 336 showing percentage pillar yield and yield reproducibility in accordance with embodiments of the present invention. In diagrams 302-306, all wafers had 85 nm of HSQ and were treated with HMDS just prior to HSQ application. In diagram 332, an HMDS only surface treatment is used. The wafers 302-308 in a batch processed at the same time are shown. It is apparent that two of the first four wafers in the batch (e.g., wafers 306 and 308) had exceptionally lower yields as pillar diameter was reduced. The range of reproducibility is great in the four simultaneously and identically prepared wafers 302-308 of diagram 332. In diagram 334, an oxygen plasma surface clean process of the prior art was used. The pillar yield of wafers 312 and 314 were particularly poor, while wafer 310 was not as bad. In diagram 336, the TMAH surface cleaning process of the present invention shows the best yields with four nearly identical wafers in a batch (e.g., collectively labeled 320).

It should be noted that pillar yield is not the same on all wafers within a single batch, even though the TaN cap layer was deposited at the same time for all. Experience has shown that aging will result in few if any standing HSQ pillars.

Figure 4:
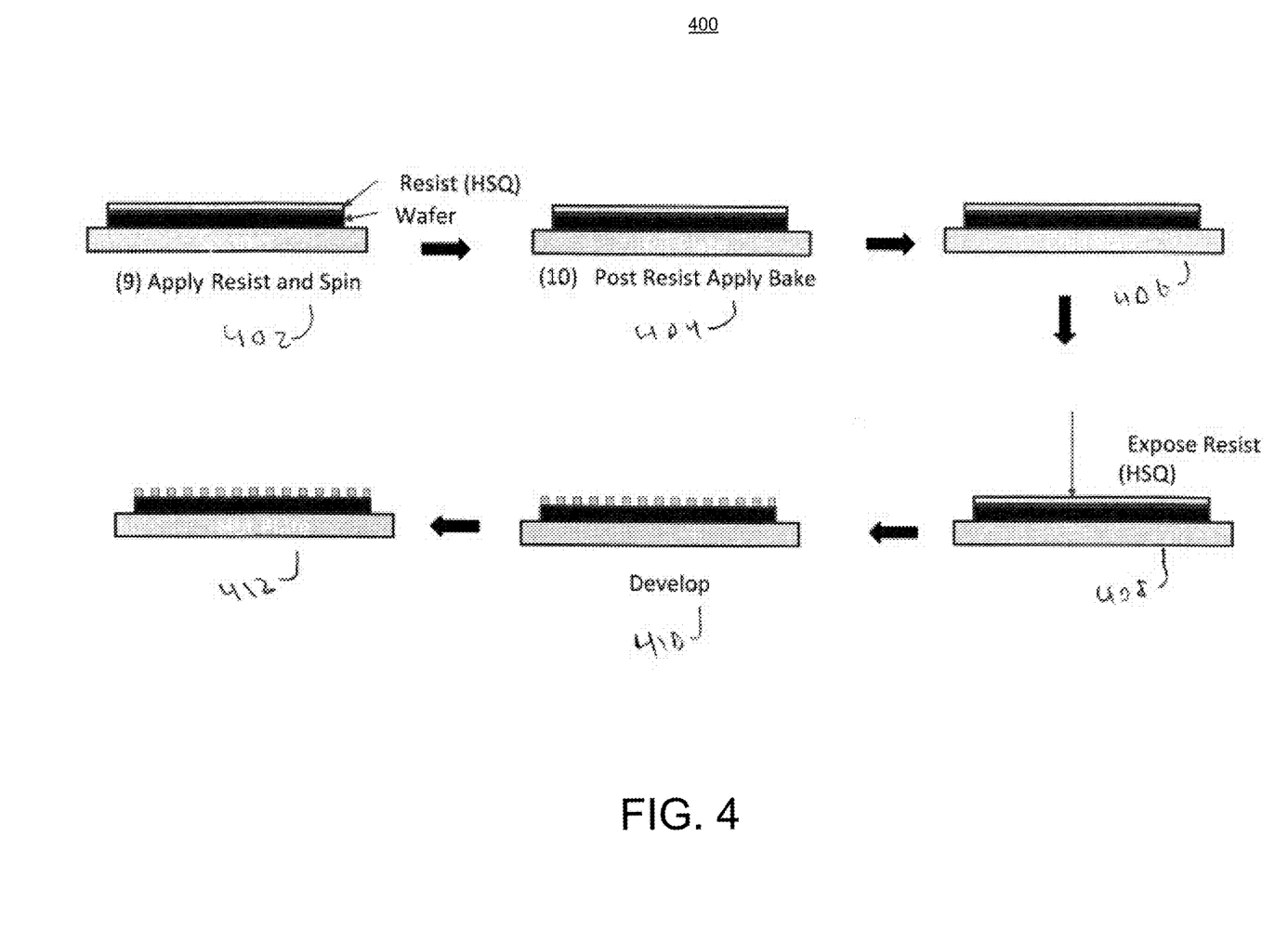
FIG. 4 visually depicts a process 400 for producing the actual pillars by exposing the resist and developing the resist to form the pillars in accordance with embodiments of the present invention.

FIG. 4 visually depicts a process 400 for producing the actual pillars by exposing the resist and developing the resist to form the pillars. These are the steps that are performed subsequent to the cleaning steps shown in FIG. 1. In step 402 the HSQ resist is applied to the cleaned hard mask layer. In step 404, after resist application, the resist on the wafer is baked. The baking process removes the carrier solvent in the resist. In step 406, the resist rests and cools to room temperature on a chill plate. In step 410, the resist is developed to form the actual pillars. It should be noted that FIG. 4 greatly exaggerates the relative size of the pillars for the purposes of explanation and illustration. In step 412, the pillars are finished using a baking process.

In this manner, embodiments of the present invention improve pillar adhesion to the surface. Embodiments of the present invention provide a surface treatment with TMAH which readily integrates into the resist application process in an MRAM photolithography process.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for improving photo resist adhesion to an underlying hard layer, comprising:
    cleaning the surface of the hard layer by applying tetramethylammonium hydroxide (TMAH) to coat a hard mask layer of the wafer;
    puddle developing the wafer for a first desired amount of time;
    rinsing the wafer for a second desired amount of time;
    spin drying the wafer;
    baking the wafer for a third desired amount of time; and
    proceeding with subsequent photolithographic processes on the wafer, which fabricates pillars therein.

2. The method of claim 1, wherein the first desired amount of time is approximately 2 minutes.

3. The method of claim 1, wherein the second desired amount of time is approximately 1 minute.

4. The method of claim 1, wherein the third desired amount of time is approximately 5 minutes.

5. The method of claim 1, wherein the rinsing uses running water and the water is deionized water.

6. The method of claim 1, further comprising cooling on a chilled plate for approximately one minute subsequent to the baking.

7. The method of claim 1, further comprising treating the wafer with hexamethyldisilazane (HMDS) subsequent to the baking.

8. The method of claim 1, wherein the underlying hard mask layer is tantalum nitride (TaN).

9. A method for improving photo resist pillar adhesion to a wafer, the method comprising:
    cleaning a surface of tantalum nitride hard layer by applying tetramethylammonium hydroxide (TMAH) to coat the tantalum nitride hard layer of the wafer;
    puddle developing the wafer for a first desired amount of time;
    rinsing the wafer in running water for a second desired amount of time;
    spin drying the wafer;
    baking the wafer for a third desired amount of time; and
    proceeding with subsequent photolithographic processes on the wafer.

10. The method of claim 9, wherein the first desired amount of time is approximately 2 minutes.

11. The method of claim 9, wherein the second desired amount of time is approximately 1 minute.

12. The method of claim 9, wherein the third desired amount of time is approximately 5 minutes.

13. The method of claim 9, wherein the water is deionized water.

14. The method of claim 9, further comprising treating the wafer with hexamethyldisilazane (HMDS) subsequent to the baking.

15. The method of claim 9, wherein the wafer is treated with hexamethyldisilazane (HMDS) subsequent to the baking.

16. A method for manufacturing an MRAM device, the method comprising:
    applying tetramethylammonium hydroxide (TMAH) to coat a tantalum nitride hard layer of a wafer;
    submerging the wafer in a dish of TMAH for a first desired amount of time;
    rinsing the wafer in running water for a second desired amount of time;
    spin drying the wafer;
    baking the wafer for a third desired amount of time; and
    proceeding with subsequent photolithographic processes on the wafer.

17. The method of claim 16 wherein the applying is a cleaning process and wherein the first desired amount of time is approximately 2 minutes.

18. The method of claim 17, wherein the second desired amount of time is approximately 1 minute.

19. The method of claim 18, wherein the third desired amount of time is approximately 5 minutes.

20. The method of claim 16, wherein the water is deionized water.

\* \* \* \* \*